(12) United States Patent
Harada et al.

(10) Patent No.: US 8,584,337 B2
(45) Date of Patent: Nov. 19, 2013

(54) ELECTRONIC COMPONENT REPAIR METHOD

(75) Inventors: Tohru Harada, Kawasaki (JP); Mitsuo Takeuchi, Kawasaki (JP); Yoshiaki Yanagida, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 38 days.

(21) Appl. No.: 13/196,437

(22) Filed: Aug. 2, 2011

(65) Prior Publication Data
US 2012/0031592 A1 Feb. 9, 2012

(30) Foreign Application Priority Data
Aug. 6, 2010 (JP) .................................. 2010-178117

(51) Int. Cl.
*B23P 9/00* (2006.01)
(52) U.S. Cl.
USPC ............... 29/402.01; 29/402.06; 29/402.07; 29/592.1; 29/840
(58) Field of Classification Search
USPC .......... 29/402.01, 402.06, 402.07, 840, 592.1
See application file for complete search history.

(56) References Cited

U.S. PATENT DOCUMENTS

| 6,201,930 | B1 * | 3/2001 | Close et al. | 392/379 |
| 6,220,503 | B1 * | 4/2001 | Cox et al. | 228/265 |
| 6,257,478 | B1 * | 7/2001 | Straub | 228/6.2 |
| 6,761,304 | B2 * | 7/2004 | Ruszowski | 228/180.21 |
| 2002/0084307 | A1 * | 7/2002 | Ruszowski | 228/51 |

FOREIGN PATENT DOCUMENTS

JP 2003-332727 A 11/2003

* cited by examiner

*Primary Examiner* — Carl Arbes
(74) *Attorney, Agent, or Firm* — Fujitsu Patent Center

(57) ABSTRACT

An electronic component repair method for removing an electronic component soldered on a substrate, the method includes: mounting a heat transfer plate on the electronic component to be removed, the heat transfer plate being formed by bonding a plurality of heat transfer members via a heat insulating member, heating the heat transfer plate mounted on the electronic component by a heating unit, the heating unit heating individually each of the heat transfer members by different heat amount; and removing the electronic component from the substrate after the heating.

5 Claims, 21 Drawing Sheets

ELECTRONIC COMPONENT REPAIR METHOD

CROSS-REFERENCE TO RELATED APPLICATION

This application is based upon and claims the benefit of priority of the prior Japanese Patent Application No. 2010-178117 filed on Aug. 6, 2010, the entire contents of which are incorporated herein by reference.

FIELD

The embodiments discussed herein are related to an electronic component repair method, an electronic component repair device, and a heat transfer plate.

BACKGROUND

A repair device is developed which removes an electronic component, such as, for example, a BGA (Ball Grid Array) package, which is surface-mounted on a substrate.

Hereinafter, a conventional repair device will be described with reference to FIG. 1.

FIG. 1 is a configuration diagram of the conventional repair device.

In FIG. 1, a pedestal 2 includes a substrate mounting unit 4 on which a substrate 3 is mounted, a movable camera 5, and a movable heater 6. The pedestal 2 is also mounted with a transport unit 9 that mounts a heat transfer plate 7 on the top surface of an electronic component 8 to be repaired and transports and removes the heated electronic component 8 along with the heat transfer plate 7 mounted thereon and a control unit 11 connected to a computer 10.

The control unit 11 has functions to transmit various control signals according to instructions from the computer 10 to at least the movable camera 5, the movable heater 6, and the transport unit 9 as well as transmit captured image information that is captured by the movable camera 5 to the computer 10.

The electronic component 8 to be repaired is a BGA package having electrodes on the bottom surface thereof and the electrodes on the bottom surface are soldered to the substrate 3.

In such a repair device 1, the computer 10 causes the movable camera 5 to capture an image of the electronic component 8 to be repaired and determines the position of the component to be repaired on the basis of the captured image. The computer 10 causes the transport unit 9 to mount the heat transfer plate 7 on an upper portion of the electronic component 8. Thereafter, the computer 10 causes the movable heater 6 to heat the heat transfer plate 7 mounted on the upper portion of the electronic component 8. Thereby, the electronic component 8 is heated and solder on the lower portion of the electronic component 8 melts. In this state, the computer 10 causes the transport unit 9 to lift the electronic component 8 along with the heat transfer plate 7, and thereby removes the electronic component 8 to be repaired.

However, as shown in FIG. 2, if an electronic component 12 having a heatsink is mounted near the electronic component 8 to be repaired on the substrate 3, the heat of the electronic component 8 is transferred to the electronic component 12.

In addition, the electronic component 8 of the BGA package has terminals on the entire bottom surface of the electronic component, and the nearer the terminal is located to the electronic component 12, the easier the heat of the terminal is transferred to the electronic component 12. Therefore, regarding the terminals of the electronic component 8, the temperature of a terminal far from the electronic component 12 becomes higher than that of a terminal near the electronic component 12. As a result, in the electronic component 8, even when the solder connecting terminals near the electronic component 12 melts, the solder connecting terminals far from the electronic component 12 may not melt. To repair the electronic component 8, the solder of all the terminals of the electronic component 8 needs to melt. Therefore, it is to heat the electronic component 8 until the solder of the terminals near the electronic component 12 melt.

Therefore, the terminals of the electronic component 8 that are far from the electronic component 12 are excessively heated, so the substrate 3 as well as areas and electronic components not to be repaired around the electronic component 8 are also unduly heated, and these electronic components may be damaged.

To solve the above problem, as shown in FIG. 3, the conventional repair device 1 uses a heat shield plate 14 (aperture) including a plurality of heat radiation holes 14a to 14d having different sizes at a heat radiation opening 13a of a heating unit 13 of the movable heater 6. Specifically, the conventional repair device 1 heats the electronic component 8 by using the heat radiation opening 13a provided with the heat shield plate 14 in which the sizes of the heat radiation holes 14a to 14d are set so that the nearer the terminals are to the electronic component 12 that dissipates a large amount of heat, the larger the amount of received heat is, and the farther the terminals are from the electronic component 12, the smaller the amount of received heat is.

Japanese Laid-open Patent Publication No. 2003-332727 is an example of related art.

SUMMARY

According to an aspect of the embodiment, an electronic component repair method for removing an electronic component soldered on a substrate, the method includes mounting a heat transfer plate on the electronic component to be removed, the heat transfer plate being formed by bonding a plurality of heat transfer members via a heat insulating member, heating the heat transfer plate mounted on the electronic component by a heating unit, the heating unit heating individually each of the heat transfer members by different heat amount, and removing the electronic component from the substrate after the heating.

The object and advantages of the embodiment will be realized and attained by means of the elements and combinations particularly pointed out in the claims. It is to be understood that both the foregoing general description and the following detailed description are exemplary and explanatory and are not restrictive of the invention, as claimed.

DESCRIPTION OF EMBODIMENTS

As described above, a conventional repair device mounts a heat transfer plate on an electronic component to be repaired and heats the electronic component to be repaired. The heat transfer plate is used to efficiently heat the electronic component to be repaired. Basically, it is preferred that the heat transfer plate is formed of a material having high heat transfer efficiency, such as copper. However, the heat transfer amount in the heat transfer plate becomes large. Therefore, even if a heat transfer plate 7 is heated so that the farther the terminals are from an electronic component that dissipates a large amount of heat, the smaller the amount of heat the terminals receive, the entire electronic component 8 to be repaired is uniformly heated, and the electronic component 8 is not efficiently heated by using only a heat shield plate having different sizes of openings.

Figure 1:
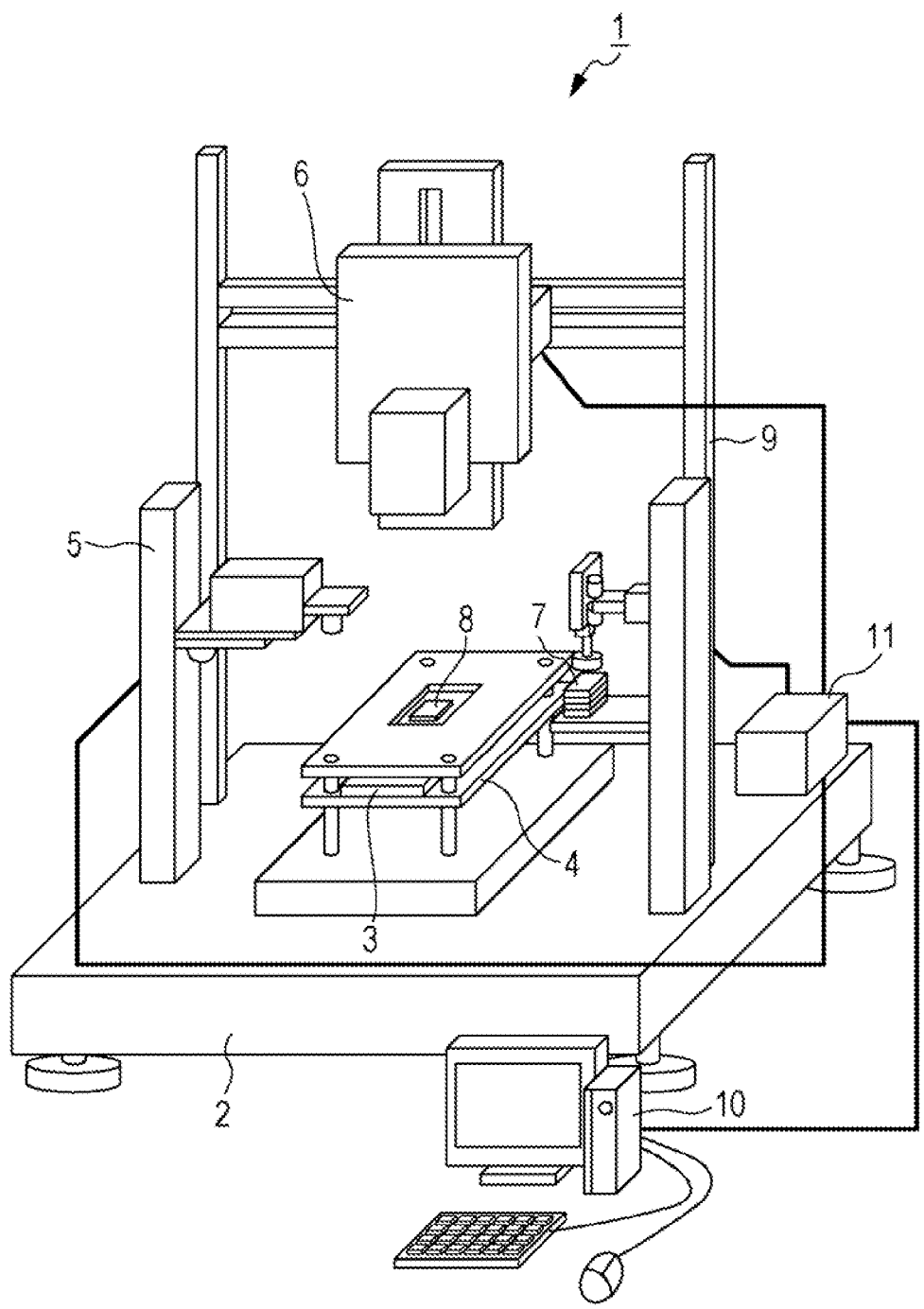
FIG. 1 is a configuration diagram of a conventional repair device.
Figure 2:
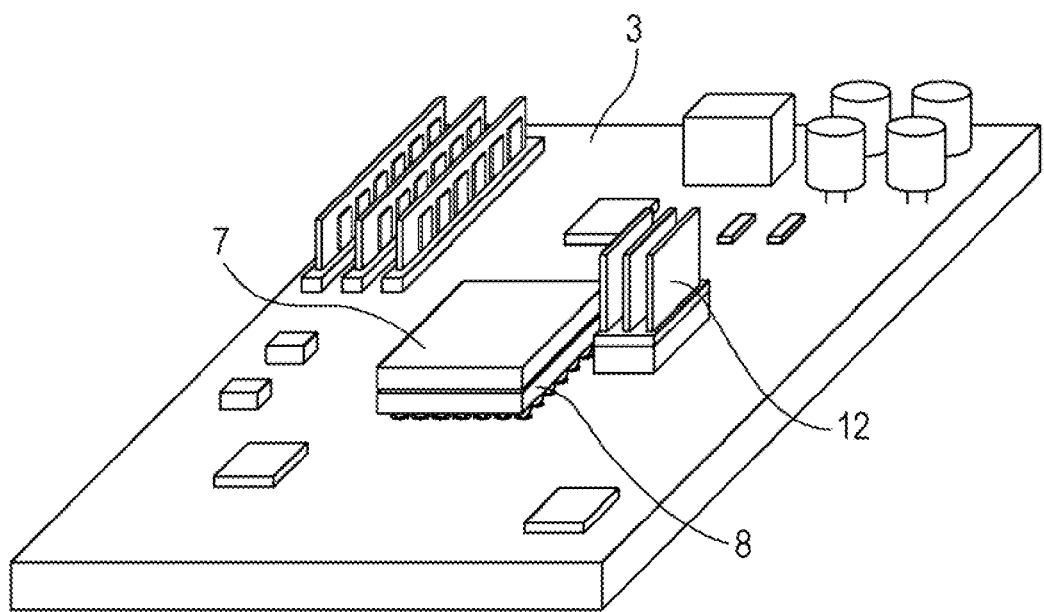
FIG. 2 is a diagram showing a state in which a conventional heat transfer plate is mounted on a component to be repaired.
Figure 3:
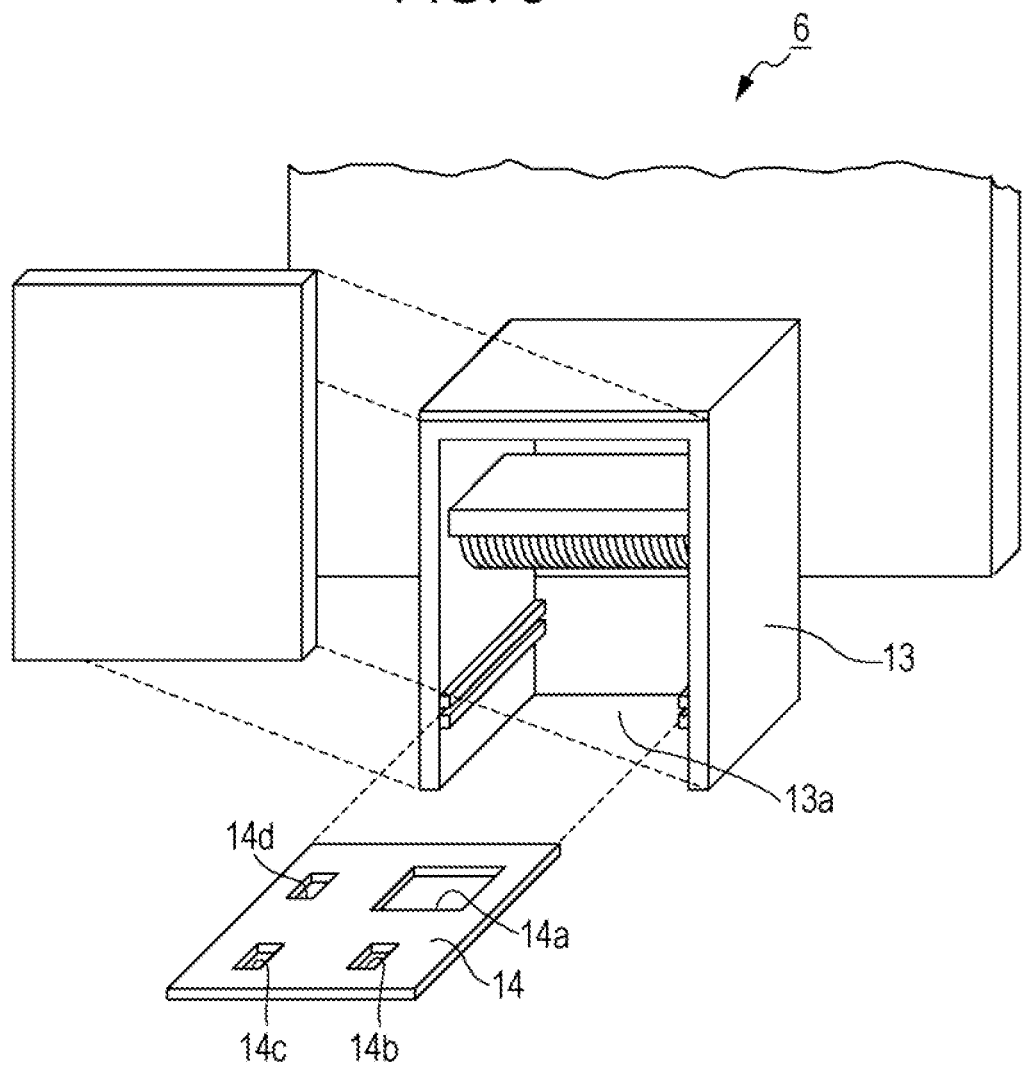
FIG. 3 is an illustration of a conventional heating unit.
Figure 4:
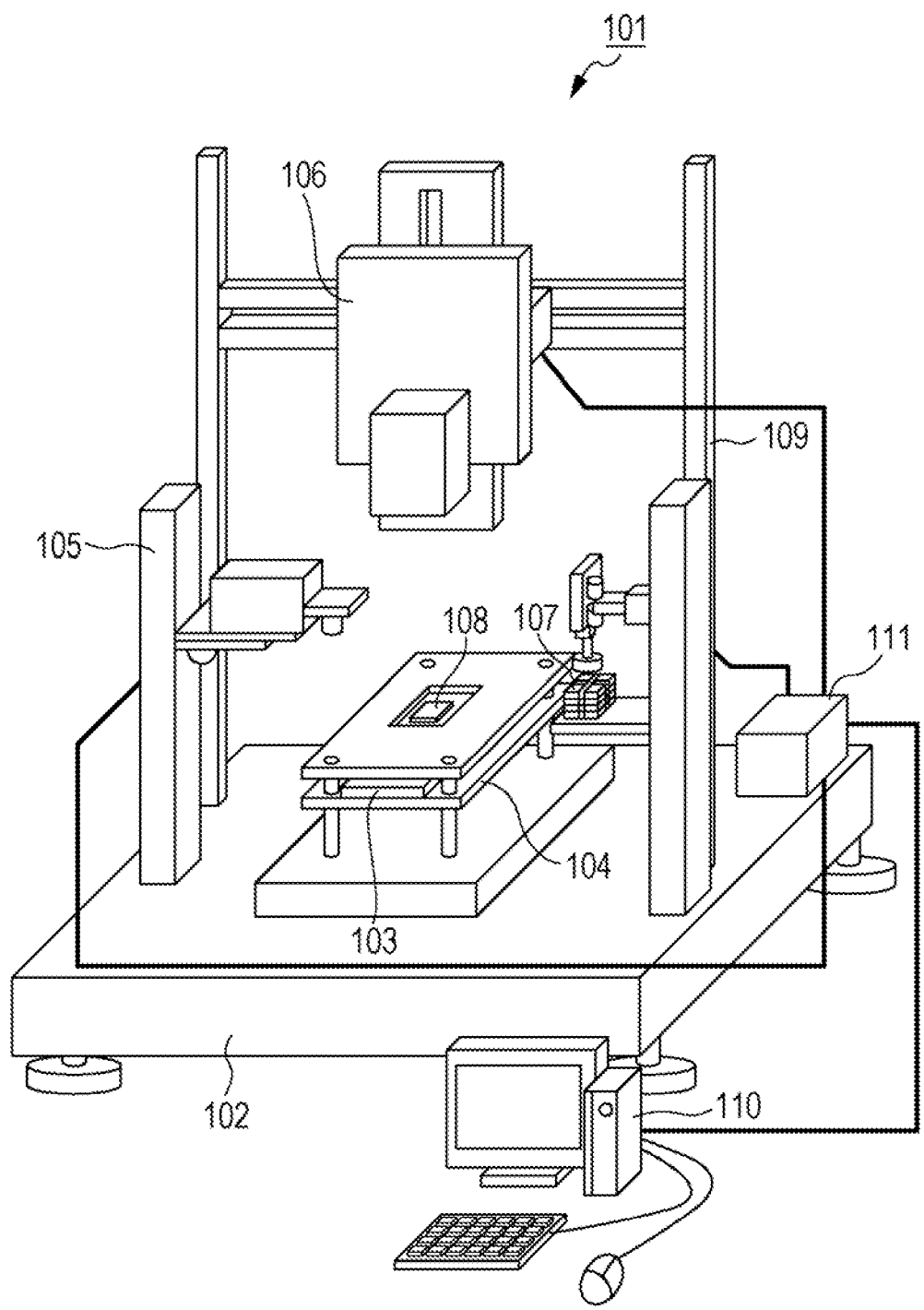
FIG. 4 is a configuration diagram of a repair device according to a present embodiment.

As a repair device that uses a heat transfer plate, a repair device according to a present embodiment can change the amount of heat applied to each area of the electronic component to be repaired FIG. 4 is a configuration diagram of a repair device 101 according to the present embodiment.

In FIG. 4, a pedestal 102 includes a substrate mounting unit 104 on which a substrate 103 is mounted, a movable camera 105, and a movable heater 106. The pedestal 102 is also mounted with a transport unit 109 that mounts a heat transfer plate 107 on the top surface of an electronic component 108 to be repaired and transports and removes the heated electronic component 108 along with the heat transfer gap 107 mounted thereon and a control unit 111 connected to a computer 110.

The control unit 111 has functions to transmit various control signals according to instructions from the computer 110 to at least the movable camera 105, the movable heater 106, and the transport unit 109 as well as transmit captured image information that is captured by the movable camera 105 to the computer 110.

The electronic component 108 to be repaired is a BGA package having electrodes on the bottom surface thereof and the electrodes on the bottom surface are soldered to the substrate 103.

Figure 5:
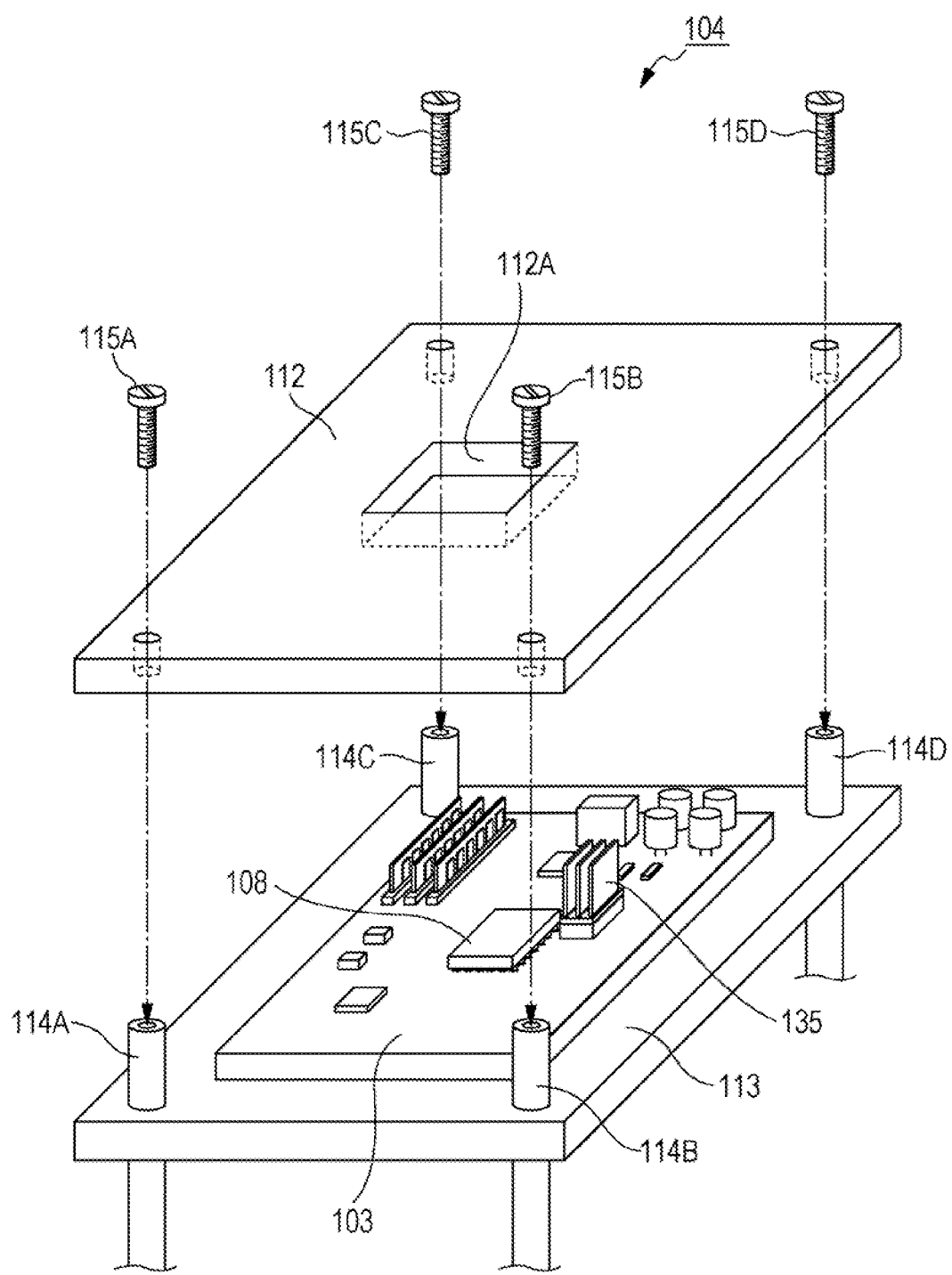
FIG. 5 is a perspective view showing a state in which a shield plate is removed from the top surface of a substrate mounting unit.

FIG. 5 is a perspective view showing a state in which a shield plate 112 is removed from the top surface of the substrate mounting unit 104. The BGA package type electronic component 108 to be repaired is surface-mounted on the substrate 103.

As shown in FIG. 5, an electronic component 135 having a heatsink is mounted near the electronic component 108 to be repaired on the substrate 103.

Further, as shown in FIG. 5, the substrate mounting unit 104 has a mounting table 113 on which the substrate 103 is mounted. Spacers 114A to 114D are respectively fixed to positions on the mounting table 113 so that the spacers 114A to 114D do not interfere with the substrate 103 mounted on the mounting table 113. The spacers 114A to 114D are taller than the heights of the electronic components mounted on the substrate 103 when the substrate 103 is mounted on the mounting table 113.

The shield plate 112 is screwed into the top surfaces of the spacers 114A to 114D. Owing to this structure, it is possible to mount the shield plate above the substrate 103 in a state in which the electronic components on the substrate 103 do not interfere with the shield plate 112.

Figure 6:
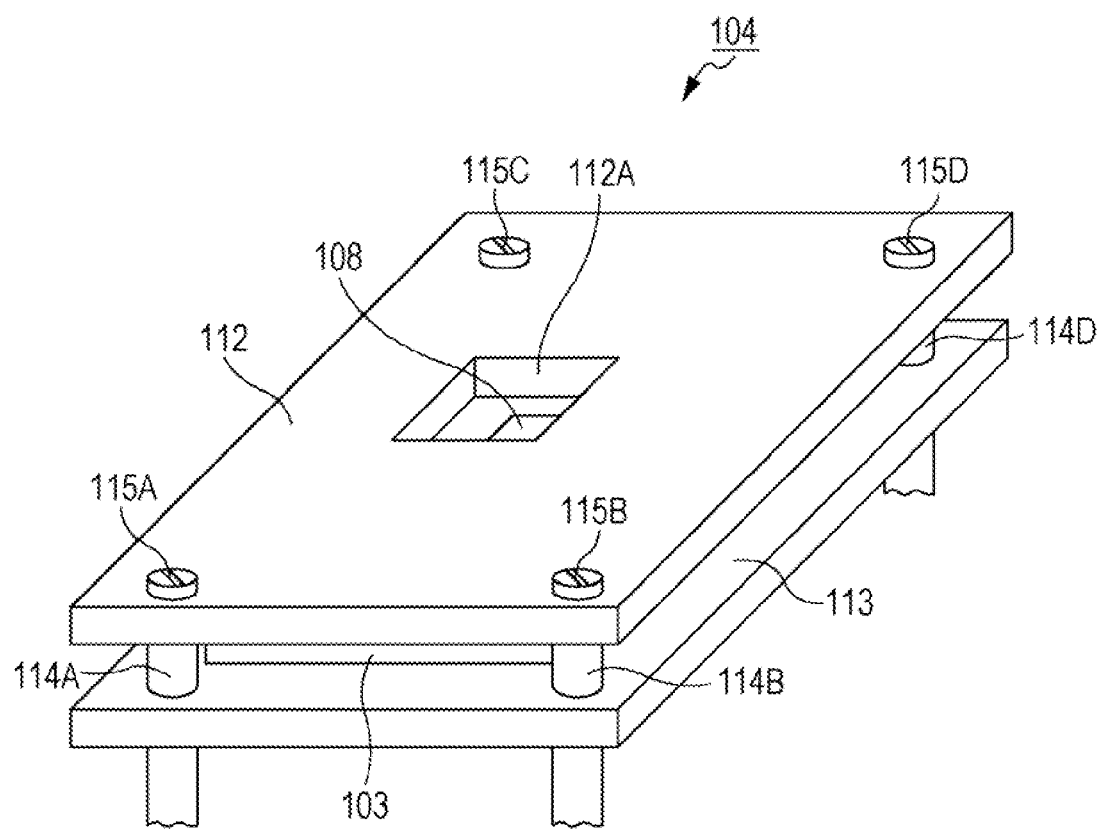
FIG. 6 is a perspective view showing a state in which the shield plate is screwed into spacers.

A window 112A is provided in the shield plate 112 above the electronic component 108 to be repaired. FIG. 6 is a perspective view showing a state in which the shield plate 112 is screwed into spacers 114. In this state, when the substrate 103 is seen from the above, all areas other than the area where the electronic component 108 to be repaired is mounted are shield by the shield plate 112. Thereby, electronic components other than the electronic component to be repaired are prevented from being directly heated by the movable heater 106.

Figure 7:
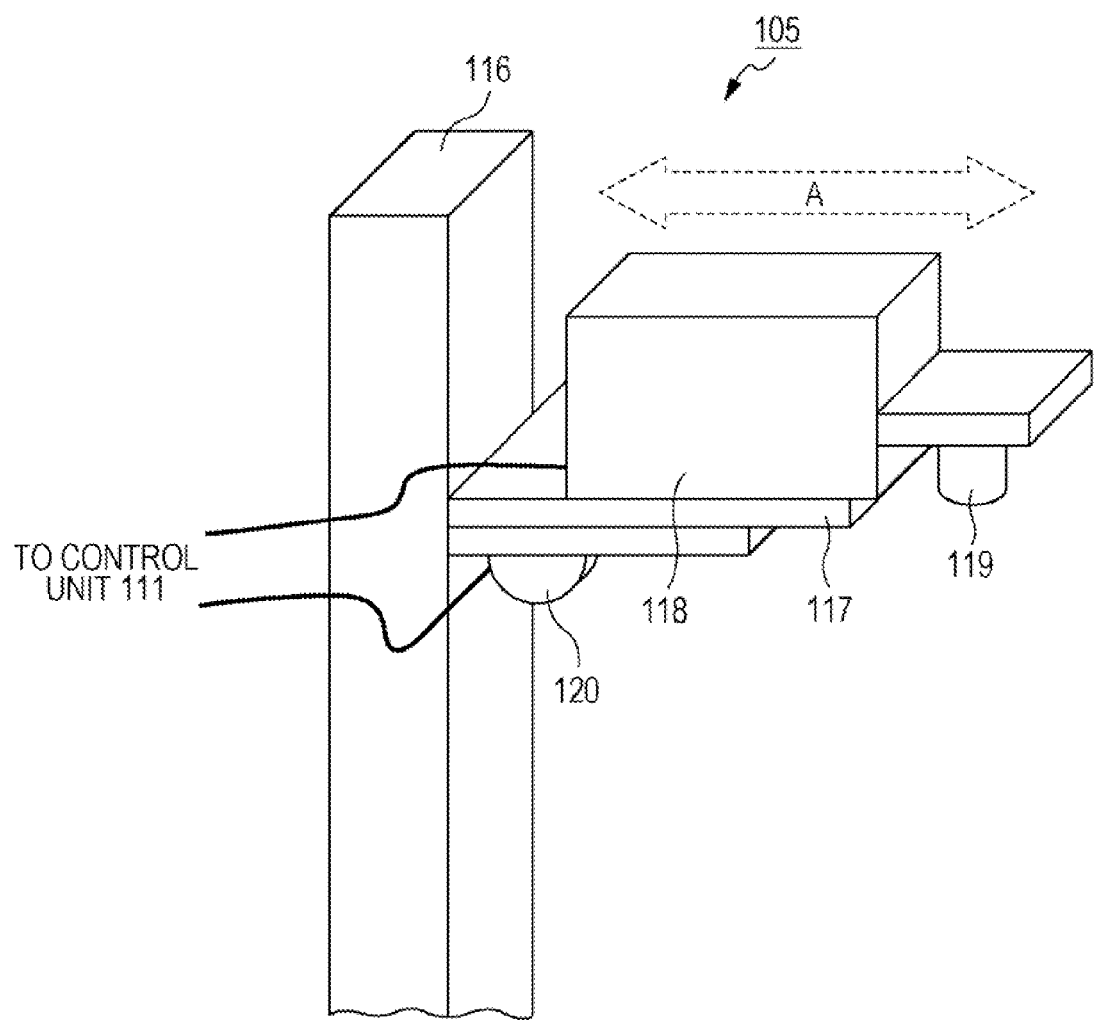
FIG. 7 is a perspective view of a movable camera.

FIG. 7 is a perspective view of the movable camera 105 in FIG. 4.

In the movable camera 5, a movable table 117 that can move in a direction toward the substrate mounting unit 104 (direction indicated by an arrow A) is provided on a pillar 116 fixed to the pedestal 102, and a camera unit 118 is mounted on the movable table 117. The camera unit 118 has an image capturing unit 119 that captures images below the camera unit 118 on the basis of a control signal from the control unit 111 described in FIG. 4. The movable table is also provided with a stepping motor 120 that moves the movable table 117 in the direction indicated by the arrow A by a given distance on the basis of the control signal from the control unit 111.

The movable camera 105 is provided to capture an image of the electronic component 108 to be repaired mounted on the substrate 103 placed on the substrate mounting unit 104.

Figure 8:
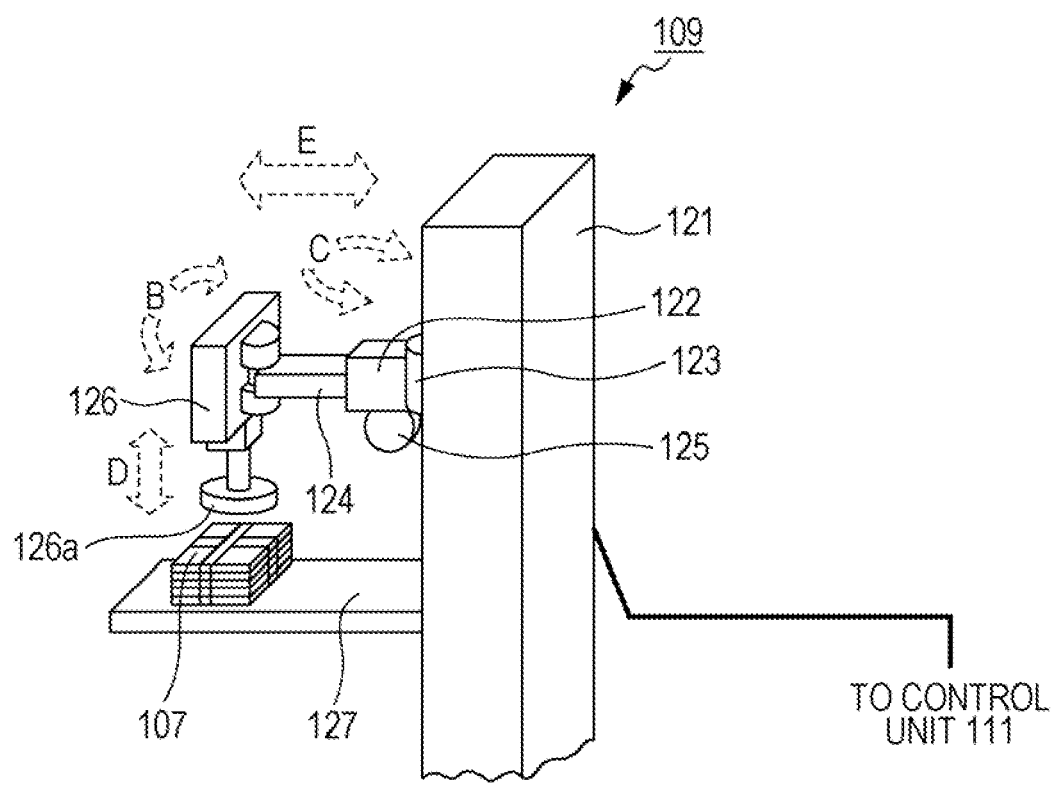
FIG. 8 is a perspective view of a transport unit.

FIG. 8 is a perspective view of the transport unit 109 in FIG. 4.

As shown in FIG. 8, the transport unit 109 has a pillar 121 mounted on the pedestal 102. A first arm unit 122, one end of which is supported rotatable in a direction indicated by an arrow C, is provided on the pillar 121. The first arm unit 122 is rotated by a stepping motor 123 in the direction indicated by the arrow C according to the control signal from the control unit 111.

A second arm unit 124, which can extend and contract in a direction indicated by an arrow E, is provided to the other end of the first arm unit 122. A stepping motor 125 extends and contracts the second arm unit 124 according to the control signal from the control unit 111.

Further, a head unit 126 having a suction head 126a that can move vertically as indicated by an arrow D is attached to the top end of the second arm unit 124 rotatable in a direction indicated by an arrow B.

In the transport unit 109, a heat transfer plate mounting table 127 on which the heat transfer plate 107 is mounted is provided below the head unit 126.

Figure 9:
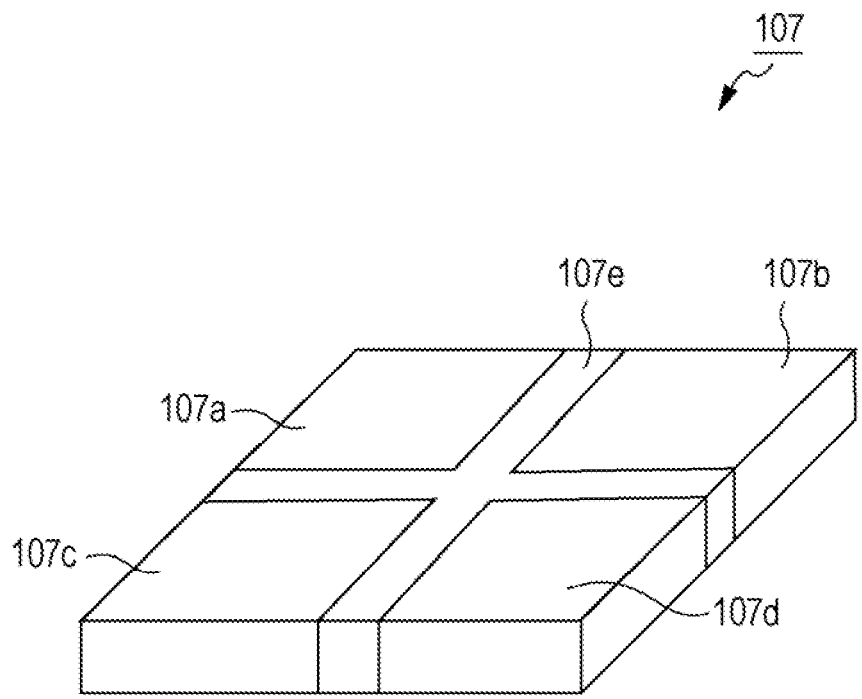
FIG. 9 is a perspective view of a heat transfer plate.

The heat transfer plate 107 will be described with reference to FIG. 9. The heat transfer plate 107 of the present embodiment is formed by separating four heat transfer members 107a to 107d formed of a material having high heat transfer efficiency, such as copper and aluminum by a heat insulating member 107e having high heat transfer resistance. The heat insulating member 107e can be formed of a heat resistant material formed from glass fiber, glass epoxy, silica, alumina, and the like.

In this way, the heat transfer plate 107 can suppress heat transfer between the heat transfer members 107a to 107d by separating the heat transfer members 107a to 107d by the heat insulating member 107e as described in the present embodiment.

Although, in the present embodiment, the heat transfer plate 107 has four heat transfer members, it is not limited to this.

Figure 10:
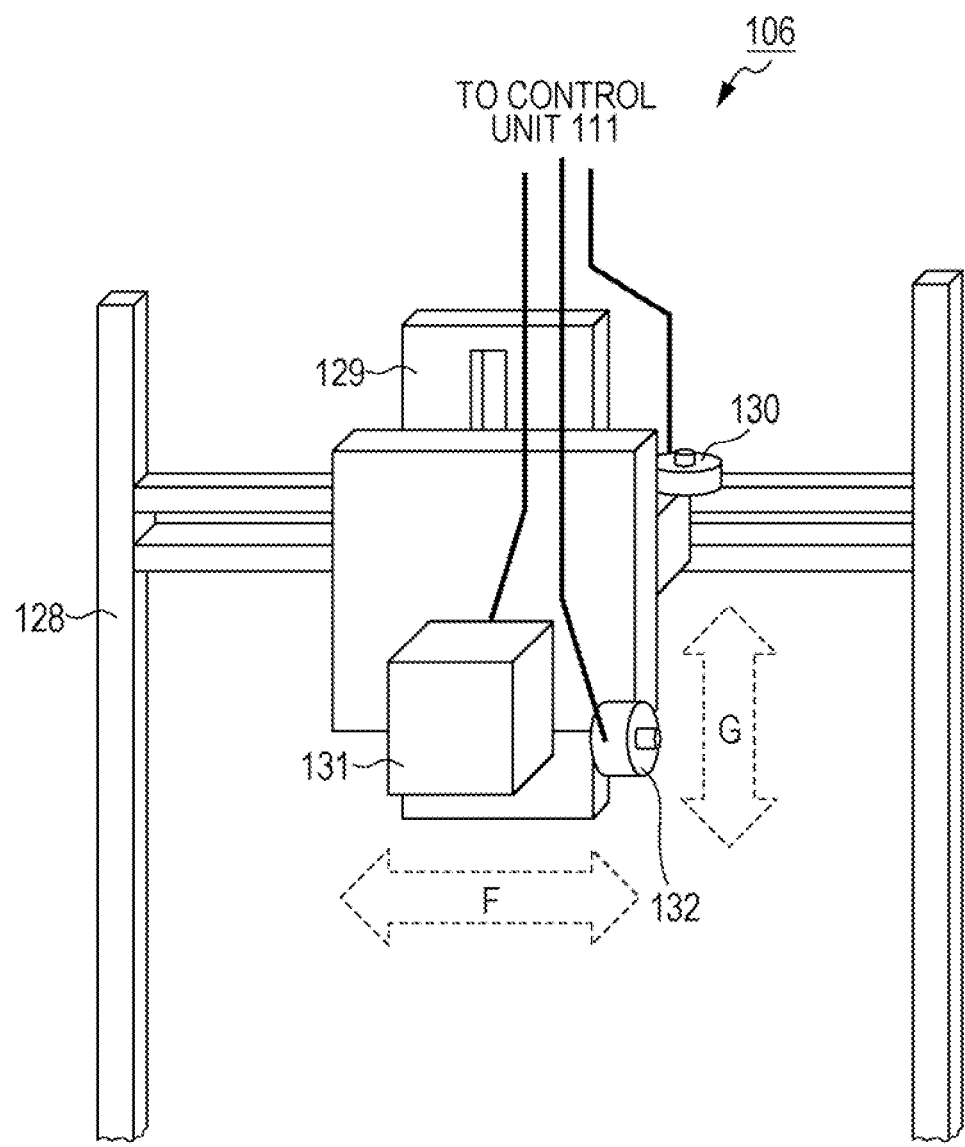
FIG. 10 is a perspective view of a movable heater.

Next, FIG. 10 is a perspective view of the movable heater 106 in FIG. 4.

In FIG. 10, a pillar 128 is mounted on the pedestal 102 not shown in FIG. 10, and a movable pedestal 129 supported movably in a direction indicated by an arrow F is attached to the pillar 128. The movable pedestal 129 is moved in the direction indicated by the arrow F by the stepping motor 130 rotating according to the control signal from the control unit 111. A heating unit 131 for heating the electronic component to be repaired is movably attached to the movable pedestal 129. The heating unit 131 moves in a direction indicated by an arrow G.

The heating unit 131 is moved in the direction indicated by the arrow G by the stepping motor 132 rotating based on the control signal from the control unit 111.

Figure 11:
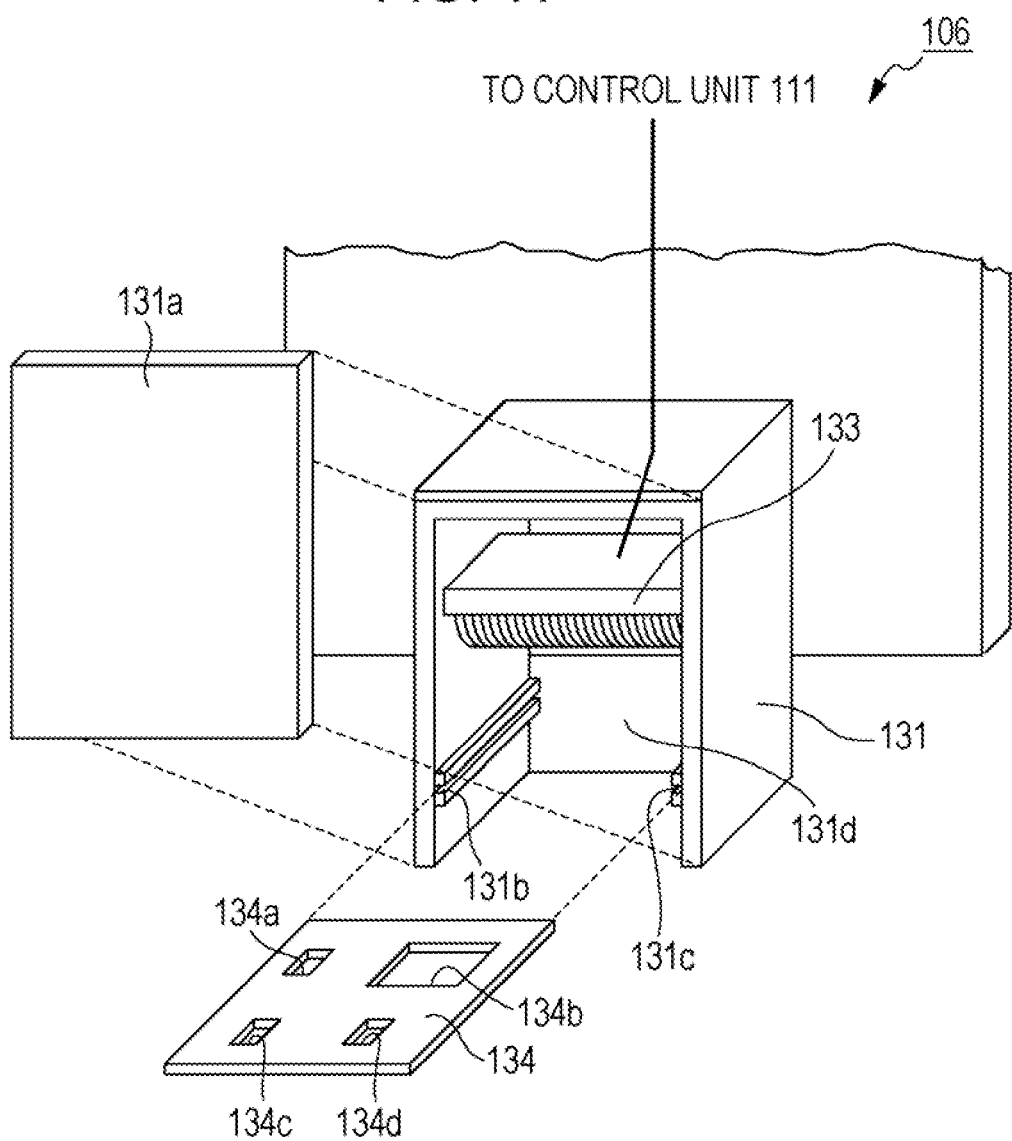
FIG. 11 is a perspective view showing a state in which a lid of a heating unit is opened.

FIG. 11 is a view showing a state in which a lid 131a of the heating unit 131 is opened.

As shown in FIG. 11, the heating unit 131 contains a heater 133 for applying heat downwardly. Grooves 131b and 131c to which a heat shield plate 134 (aperture) is inserted are provided in a lower portion of the heating unit 131.

Figure 12:
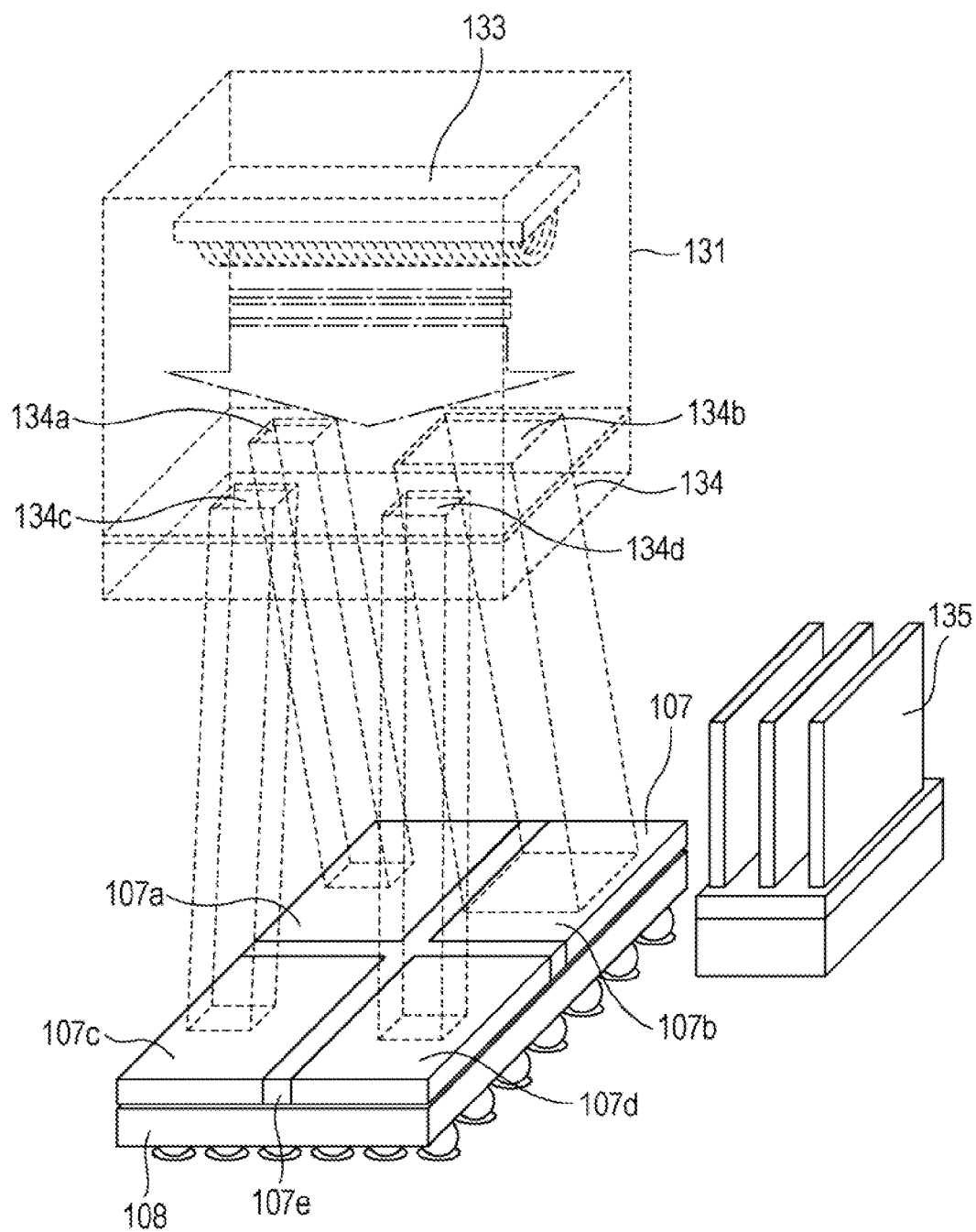
FIG. 12 is an illustration of the heating unit.

Further, the heat shield plate 134 has a plurality of heat radiation holes 134a to 134d having different sizes from each other. As shown in FIG. 12, the heat radiation holes 134a to 134d are provided in positions through which the heat transfer members 107a to 107d of the heat transfer plate 107 can be heated.

Heat radiated from the heater 133 is transferred to the heat transfer members 107a to 107d through the heat radiation holes 134a to 134d, and thereby the heat transfer members 107a to 107d are heated. At this time, as shown in FIG. 12, by forming the heat radiation hole 134b, which corresponds to the heat transfer member 107b located near the electronic component 135 having high heat dissipation performance, larger than the other heat radiation holes 134a, 134c, and 134d, the amount of heat applied to the heat transfer member 107b becomes larger than that applied to the other heat transfer members 107a, 107c, and 107d.

Further, as described above, heat transfer between the heat transfer members 107a to 107d is suppressed by the heat insulating member 107e, so it is possible to suppress the phenomenon in which the entire electronic component 108 to be repaired is heated even when a part of the heat transfer plate 107 is heated as is observed in a conventional method.

As a result, in the present embodiment, it is possible to apply a larger amount of heat to an area of the electronic component 108 to be repaired located below the heat transfer member 107b than an amount of heat applied to the other areas of the electronic component 108.

Although, in the present embodiment described above, the number of the heat transfer members 107a to 107d is the same as the number of the heat radiation holes 134a to 134d, it is not limited to this if the amounts of heat received by the heat transfer members 107a to 107d from the heater 133 are set to desired amounts of heat.

Figure 13:
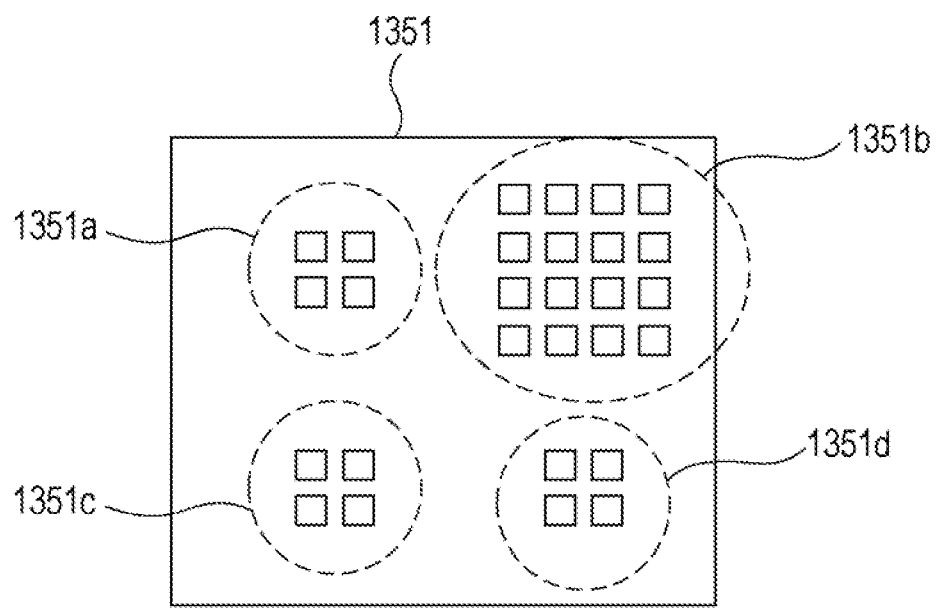
FIG. 13 is a top view of a heat shield plate.

For example, as shown by heat radiation hole groups 1351a to 1351d in a heat shield plate 1351 in FIG. 13, it can be considered to provide a plurality of small heat radiation holes corresponding to the heat transfer members 107a to 107d and change the number of heat radiation holes in each heat radiation hole group according to the amount of heat to be applied.

Figure 14:
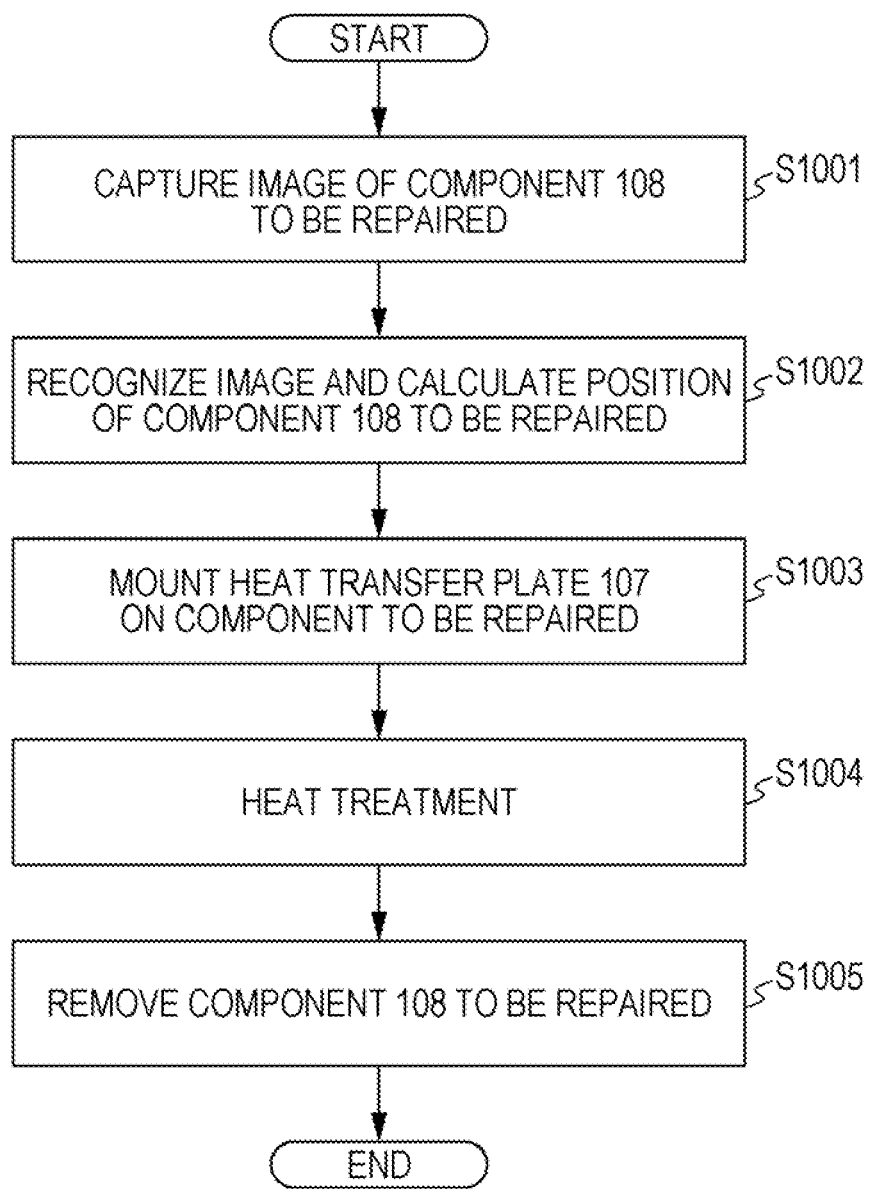
FIG. 14 is a control flowchart of a repair device.

The operation of the repair device 101 will be described on the basis of flowchart in FIG. 14. In the repair device 101 of the present embodiment, each processing is performed by transmitting the control signal of the computer 110 to each unit via the control unit 111 or transmitting various data from each unit to the computer 110 via the control unit 111 as described in FIG. 4. Therefore, in the description below, it is assumed that the communication between the computer 110 and each unit is performed via the control unit 111 unless otherwise described.

First, the computer 110 controls the movable camera 105 to capture an image of the electronic component 108 to be repaired (S1001).

Specifically, the processing is performed according to the procedure described below.

Figure 15:
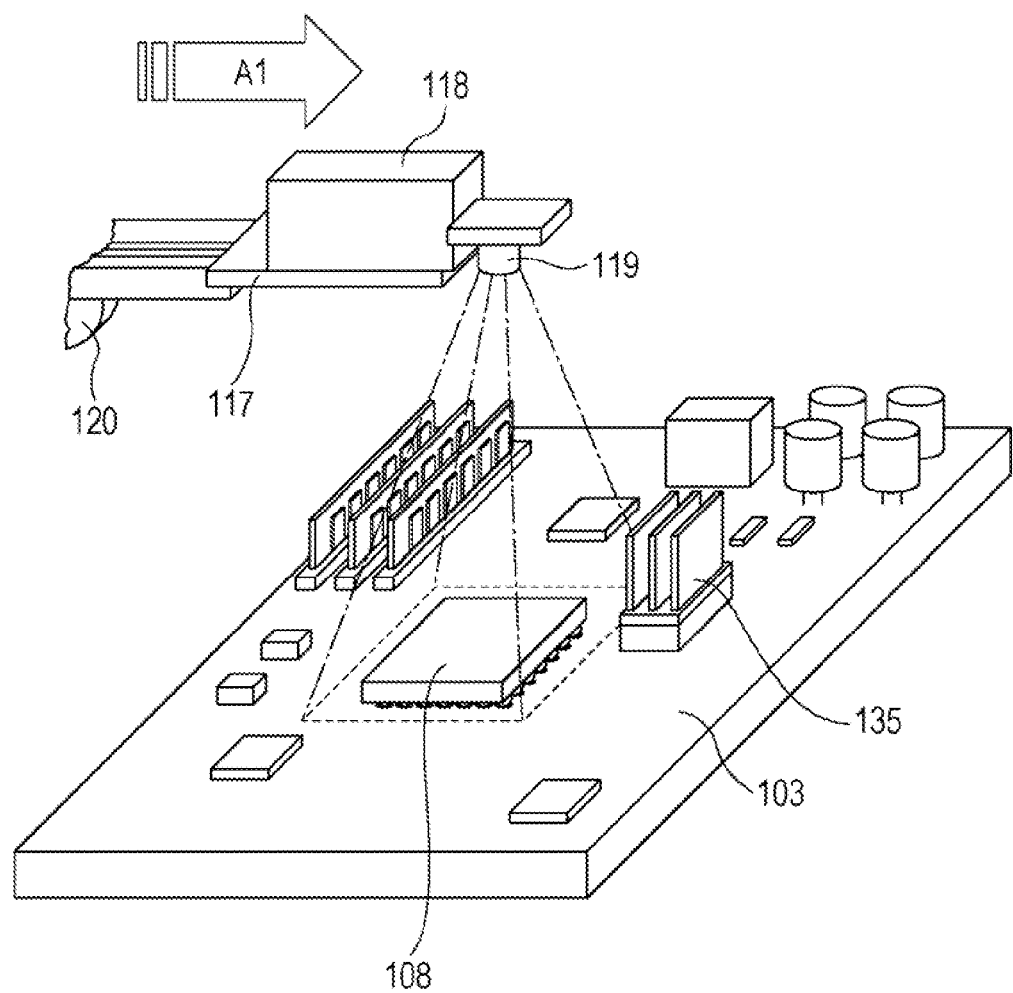
FIG. 15 is a view for explaining an operation of an image capturing camera.

First, as shown in FIG. 15, on the basis of an instruction from the computer 110, the stepping motor 120 of the image capturing camera 105 moves the movable table 117 in a direction indicated by an arrow A1 to a predetermined position where the image capturing unit 119 of the camera unit 118 is located immediately above the electronic component 108 to be repaired. (For convenience of description, the shield plate 112 is not shown in FIG. 15.)

After the movement of the movable table 117 is completed, the image capturing unit 119 captures an image. As described above, the image capturing unit 119 captures an image in downward direction, so, at the predetermined position, the image capturing unit 119 captures an image of the electronic component 108 to be repaired as viewed from the above. Then, the image capturing unit 119 transmits the captured image to the computer 110.

After the image capturing processing is completed, the computer 110 performs control for moving the image capturing unit 119 in a direction opposite to the direction indicated by the arrow A1 and returning the image capturing unit 119 to the original position.

After the processing of S1001, when the computer 110 receives the captured image, the computer 100 performs image recognition of the captured image and detects the position of the electronic component 108 to be repaired on the image (S1002). As described above, the image capturing unit 119 captures an image at the predetermined position. Therefore, if the position of the electronic component 108 to be repaired on the captured image is detected, the position of the electronic component 108 to be repaired can be identified.

The position identification is performed to identify the correct position of the electronic component 108 to be repaired because the substrate 103 is re-set for each repair operation and the position of the electronic component 108 to be repaired is shifted for each repair operation.

Next, the computer 110 controls the transport unit 109 to perform control for mounting the heat transfer plate 107 on the electronic component 108 to be repaired on the basis of the position identified by the processing in S1002 (S1003).

Specifically, the computer 110 controls the stepping motors 123 and 125 and the head unit 126 of the transport unit 109 and causes the suction head 126a to come into contact with the heat transfer plate 107 on the heat transfer plate mounting table 127. In this contact state, the suction head 126a sucks the heat transfer plate 107 on the heat transfer plate mounting table 127.

Figure 16:
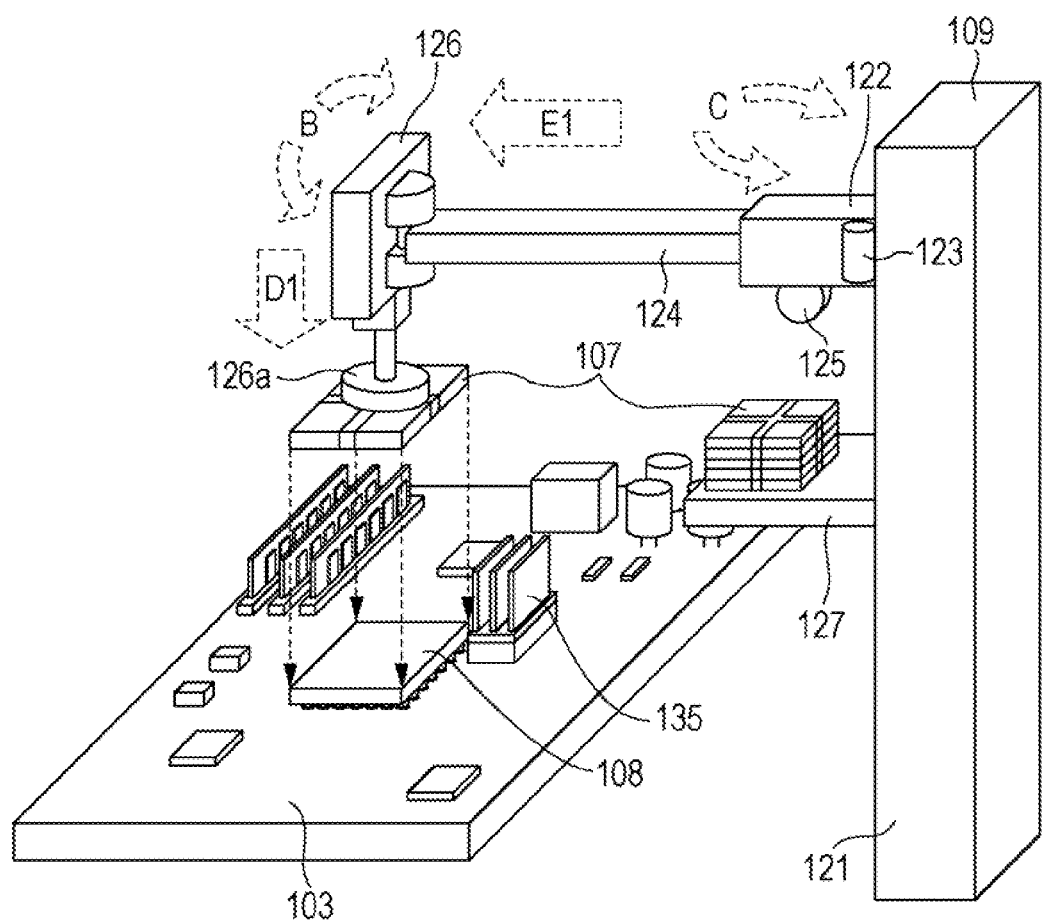
FIG. 16 is a view for explaining a heat transfer plate mounting operation of the transport unit.

When the sucking is completed, as shown in FIG. 16, the computer 110 performs control so that the heat transfer plate 107 sucked by the suction head 126a is moved to a position immediately above the position of the electronic component 108 to be repaired which is identified by the processing in S1002 (S1003). (For convenience of description, the shield plate 112 is omitted in FIG. 16.)

This control is performed by the computer 110 controlling the stepping motors 123 and 125 and the head unit 126 to move the head unit 126, the first arm unit, and the second arm unit in the directions indicated by arrows B, C, and E1.

Thereafter, the computer 110 controls the head unit 126 to move the suction head 126a in the direction indicated by an arrow D1, and thereby mounts the heat transfer plate 107 sucked by the suction head 126a on the electronic component 108 to be repaired.

Then, the computer 110 controls the stepping motors 123 and 125 and the head unit 126 to return the head unit 126 to the initial position.

Figure 17:
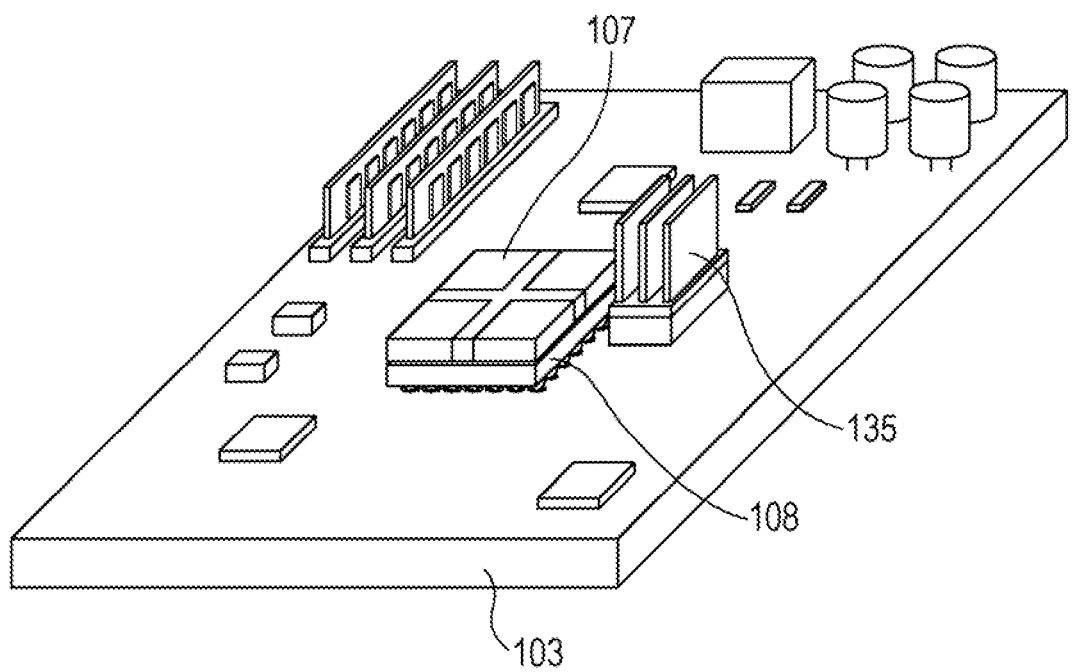
FIG. 17 is a diagram showing a state in which the heat transfer plate is mounted on an electronic component to be repaired.

FIG. 17 shows a state in which the heat transfer plate 107 is mounted on the electronic component 108 to be repaired by the processing in S1003.

When the processing of S1003 is completed, the computer 110 controls the movable heater 106 to perform heating processing of the electronic component 108 to be repaired (S1004).

Specifically, the computer 110 controls the stepping motor 130 to move the movable pedestal 129 so that the heating unit 131 is moved to a position immediately above the electronic component 108 to be repaired.

Figure 18:
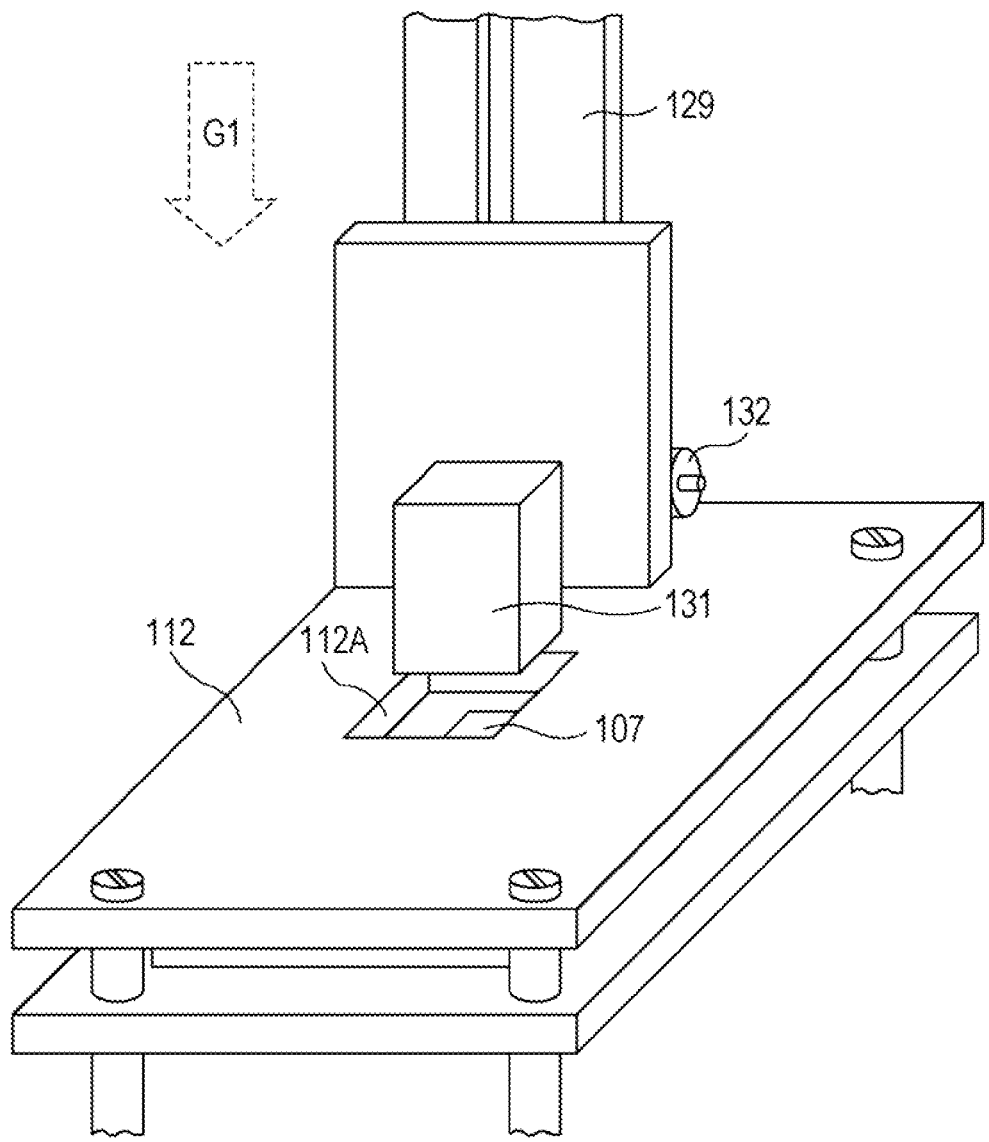
FIG. 18 is a view for explaining an operation of the heating unit.

Next, as shown in FIG. 18, the computer 110 controls the stepping motor 132 to move the heating unit 131 downward in a direction indicated by an arrow G1.

Then, the computer 110 issues an instruction of heating to the heating unit 131.

Responding to this, the heating unit 131 starts heating. The process of heating has already been described in the description of the movable heater 106 using FIGS. 10 and 11, so the detailed description thereof will be omitted.

Regarding the heating time, the heating is performed for a period of time corresponding to the period of time in which the temperature of the solder which connects terminals on the bottom surface of the electronic component to be repaired is considered to become the melting point.

As shown in FIG. 12, the heat transfer members 107a to 107d of the heat transfer plate 107 mounted on the electronic component 108 to be repaired are individually heated by the heat radiation holes 134a to 134d in the heat shield plate 134 of the heating unit 131. The heat transfer members 107a to 107d are separated by the heat insulating member 107e, and heat transfer between the heat transfer members 107a to 107d is suppressed. Therefore, each area of the electronic component 108 to be repaired corresponding to the heat transfer members 107a to 107d is respectively heated by an amount of heat corresponding to the heat radiation holes 134a to 134d.

In addition, in the present embodiment as described above, the heat radiation hole 134b is formed larger than the other heat radiation holes 134a, 134c, and 134d, so the heat transfer member 107b located near the electronic component 135 having high heat dissipation performance receives an amount of heat larger than that received by the other heat transfer members 107a, 107c, and 107d. Thereby, increases in temperature for each area of the electronic component corresponding to the heat transfer members can be uniformed because the heat transfer member 107b receives an extra amount of heat corresponding to the heat transferred to the electronic component 135 having high heat dissipation performance.

After the heating time has elapsed, the computer 110 stops heating of the head unit 126 and moves the head unit 126 in a direction opposite to the direction indicated by the arrow G1.

Figure 19:
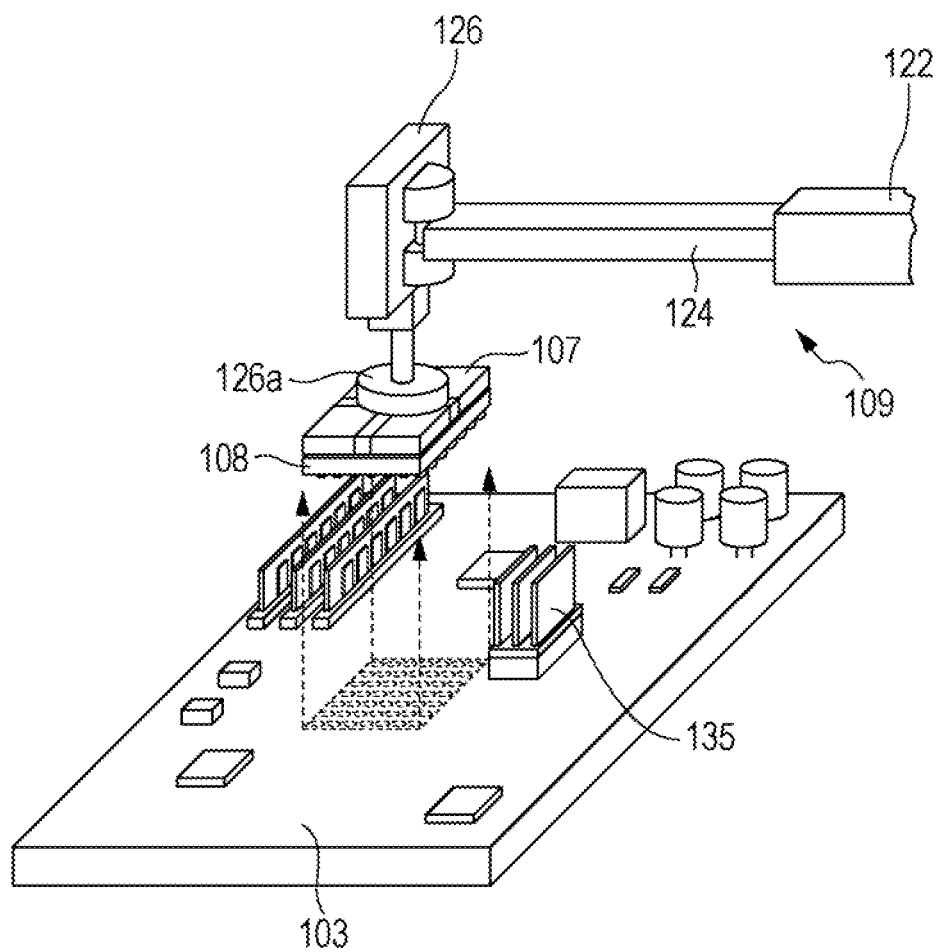
FIG. 19 is a view for explaining a component removing operation of the transport unit.

Thereafter, as shown in FIG. 19, the computer 110 controls again the transport unit 109 to perform control for sucking the electronic component 108 to be repaired along with the heat transfer plate 107 and removing them from the substrate 3 (S1005).

By doing the operation as described above, the electronic component 108 to be repaired can be removed from the substrate 103.

In the present embodiment, the heat transfer plate 107 is formed by a plurality of heat transfer members 107a to 107d and the heat transfer members 107a to 107d are separated by the heat insulating member 107e. Thereby, in the present embodiment, even when the heat transfer plate 107 is used, it is possible to heat the electronic component 108 to be repaired by dividing the electronic component 108 into a plurality of areas. Therefore, the electronic component 108 can be effectively heated according to influence of electronic components arranged around the electronic component 108.

In the embodiment described above, the amount of heat to be applied is adjusted by providing the heat shield plate 134 having the heat radiation holes 134a to 134d to the heating unit 131.

However, the type and arranged position of the electronic component on the substrate 103 vary for each type of the substrate 103, so it might be to change the sizes of the heat radiation holes 134a to 134d according to the type of the substrate 103. As a result, in the embodiment described above, every time the type of the substrate 103 is changed, the heat shield plate 134 needs to be changed.

Figure 20:
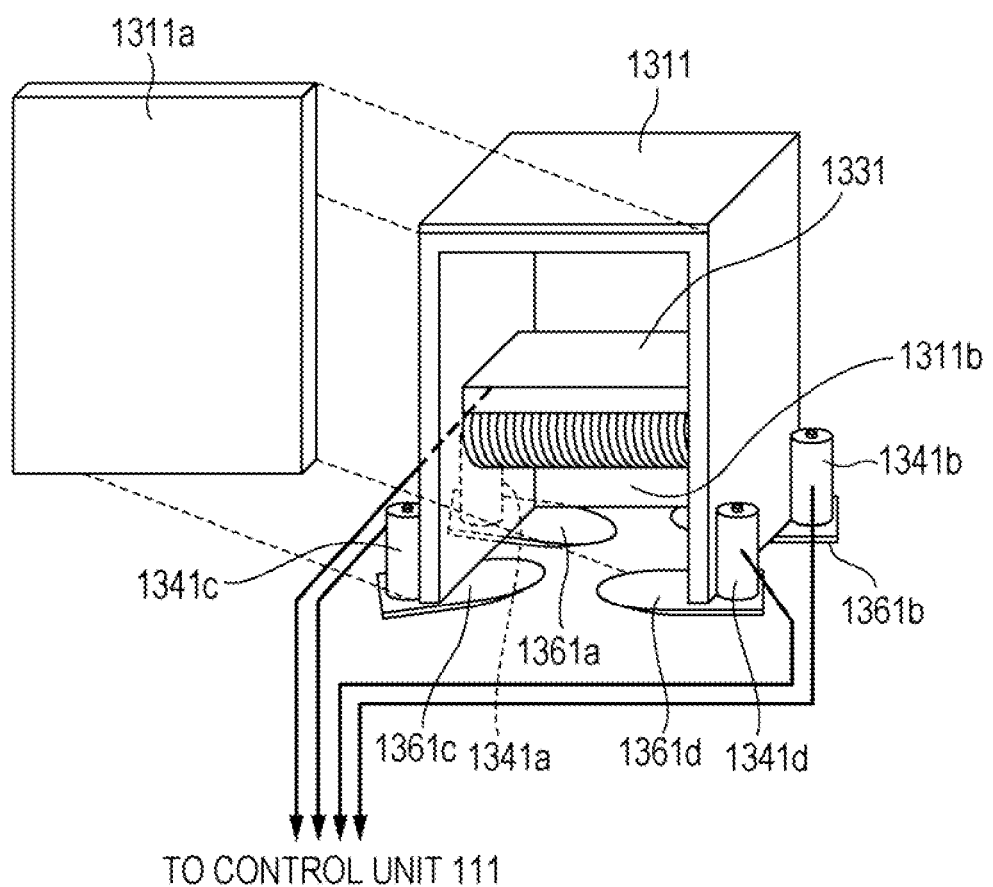
FIG. 20 is a perspective view of the heating unit.

To cope with the above, a heating unit 1311 as shown in FIG. 20 may be used instead of the heating unit 131.

The heating unit 1311 shown in FIG. 20 does not have the heat shield plate 134. Instead of the heat shield plate 134, small stepping motors 1341a to 1341d are attached to four corners of the housing of the heating unit 1311. The stepping motors 1341a to 1341d can respectively rotate heat shield pieces 1361a to 1361d in parallel with a heat radiation opening 1311b of the heating unit 1311 by the control signal from the control unit 110.

The heat shield pieces 1361a to 1361d are formed into a size that does not interfere with the other heat shield pieces 1361a to 1361d when the heat shield pieces 1361a to 1361d rotate.

Figure 21:
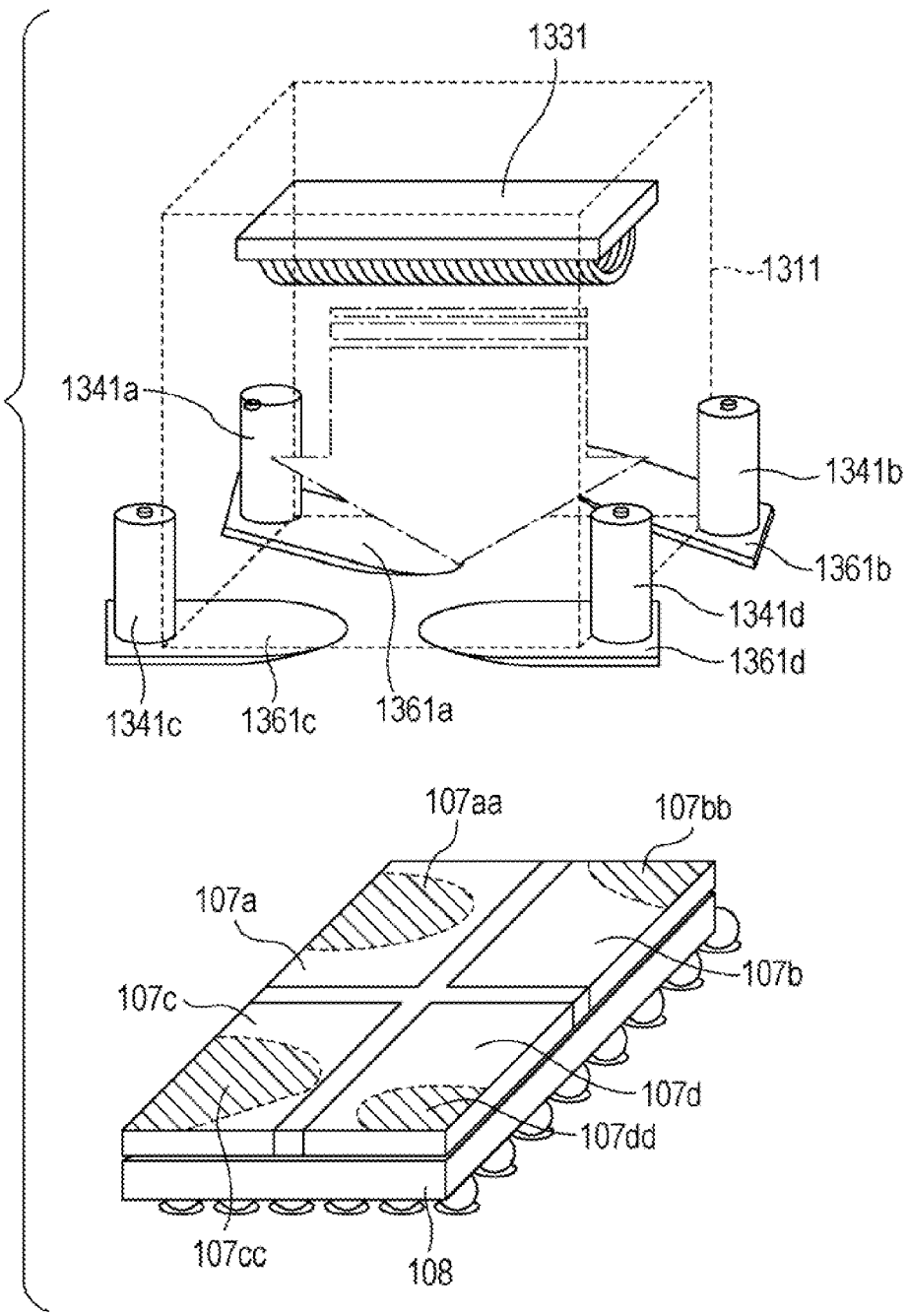
FIG. 21 is a view for explaining an operation of the heating unit.

If the heating unit 1311 is formed as described above, as shown by shaded areas 107aa to 107dd in FIG. 21, the heat from the heater 1331 is shielded by an amount corresponding to the heat shield pieces 1361a to 1361d for each heat transfer members 107a to 107d of the heat transfer plate 107.

Therefore, by performing control for appropriately rotating the stepping motors from the computer 110, the amounts of heat from the heater 1331 that are shielded by the heat shield pieces 1361a to 1361d can be adjusted.

Therefore, if the heating unit 1311 is used, the heat applied to each heat transfer member 107a to 107d can be adjusted without changing the shield plate 134 each time the type of the substrate 103 changes.

After a BGA is removed from a substrate by the repair device, a new BGA can be mounted again on the substrate from which the BGA is removed by using a separate BGA mounter, and then the new BGA can be mounted again on the substrate by using the repair device. Also, by providing a mounter device to the repair device, the above function can be realized.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. An electronic component repair method for removing an electronic component soldered on a substrate, the method comprising:
    mounting a heat transfer plate on the electronic component to be removed, the heat transfer plate being formed by bonding a plurality of heat transfer members via a heat insulating member;
    heating the heat transfer plate mounted on the electronic component by a heating unit, the heating unit heating individually each of the heat transfer members by different heat amount; and
    removing the electronic component from the substrate after the heating.

2. The electronic component repair method according to claim 1, wherein
    the electronic component is a surface-mounted electronic component having a plurality of terminals on a surface facing the substrate, each of the terminals being fixed to the substrate by soldering, and
    the heating heats each of the heat transfer members so that solder of the terminals melts at substantially the same time by the heating unit.

3. The electronic component repair method according to claim 2, wherein
    the heater includes
    a heater,
    a shield plate which is placed between the heater and the electronic component when the heat transfer plate is heated, the shield plate having a plurality of openings through which heat from the heater passes when the heat transfer plate is heated, and
    the openings are respectively arranged in positions facing the heat transfer members when the heat transfer plate is heated.

4. The electronic component repair method according to claim 2, wherein
    the openings are respectively formed into sizes corresponding to amounts of heat applied to the heat transfer members.

5. The electronic component repair method according to claim 2, wherein
    the heating unit includes
    a heater, and
    a plurality of shield pieces being placed between the heat transfer plate and the heater, each of the of shield pieces movably mounting so that predetermined amounts of heat are applied to the heat transfer members.

* * * * *